(12) United States Patent
Gilberton (10) Patent No.: US 7,359,683 B2
(45) Date of Patent: Apr. 15, 2008

(54) PREDISTORTER FOR USE IN A WIRELESS TRANSMITTER

(75) Inventor: Philippe Gilberton, Princeton, NJ (US)

(73) Assignee: Thomson Licensing, Boulogne Billancourt (FR)

( * ) Notice: Subject to any disclaimer, the term of this patent is extended or adjusted under 35 U.S.C. 154(b) by 101 days.

(21) Appl. No.: 10/576,389

(22) PCT Filed: Oct. 20, 2003

(86) PCT No.: PCT/US03/33276

§ 371 (c)(1),
(2), (4) Date: Apr. 19, 2006

(87) PCT Pub. No.: WO2005/050831

PCT Pub. Date: Jun. 2, 2005

(65) Prior Publication Data
US 2007/0087704 A1 Apr. 19, 2007

(51) Int. Cl.
H04B 1/04 (2006.01)

(52) U.S. Cl. .................. 455/114.3; 455/114.2; 375/296

(58) Field of Classification Search ............. 455/114.3, 455/114.2, 114.1, 119; 375/296, 297
See application file for complete search history.

(56) References Cited

U.S. PATENT DOCUMENTS

| | | | |
|---|---|---|---|
| 5,915,213 A | 6/1999 | Iwatsuki et al. | |
| 6,922,552 B2 * | 7/2005 | Noori | 455/114.3 |
| 6,973,138 B1 * | 12/2005 | Wright | 375/297 |
| 2002/0079964 A1 | 6/2002 | Miyatani | |

OTHER PUBLICATIONS

Search Report dtd. Mar. 18, 2004.
'Improvement of Third-Order Intermodulation Product of RF and Microwave Amplifiers by Injection' Colin S. Aitchison, Fellow, IEEE Trans. MTT vol. 49, No. 6, Jun. 2001.

* cited by examiner

Primary Examiner—Edward F. Urban
Assistant Examiner—Christian A. Hannon
(74) Attorney, Agent, or Firm—Joseph J. Laks; Paul P. Kiel; Joseph J. Opalach (57) ABSTRACT

A wireless radio frequency (RF) transmitter includes a power amplifier and a predistorter for injecting a distortion signal into an RF signal prior to amplification for use in linearizing the power amplifier; wherein the predistorter includes a phase shifter operating at less than twice a carrier frequency of the RF signal.

12 Claims, 6 Drawing Sheets

PREDISTORTER FOR USE IN A WIRELESS TRANSMITTER

This application claims the benefit, under 35 U.S.C. § 365 of International Application PCT/US2003/033276, filed Oct. 20, 2003, which was published in accordance with PCT Article 21(2) on Jun. 2, 2005 in English.

BACKGROUND OF THE INVENTION

The present invention generally relates to wireless transmitting devices, and more particularly, to techniques for linearization of a power amplifier.

In wireless communications systems, such as the Universal Mobile Telephone System (UMTS), a power amplifier is often driven into the non-linear operating region to increase transmission efficiency. Unfortunately, this causes spectral broadening and in-band distortion. As such, various techniques have been developed to linearize the operation of the transmitter (often referred to as linearization of the power amplifier) while still operating the power amplifier efficiently.

One such technique is predistortion. Generally speaking, in predistortion the signal-to-be-transmitted is first distorted in a complementary fashion to the distortion introduced by the power amplifier. In effect, the distortion introduced into the signal-to-be-transmitted cancels the distortion caused by the non-linear operation of the power amplifier. Thus, the overall impression is that the transmitter includes an ideal linear amplifier.

Figure 6:
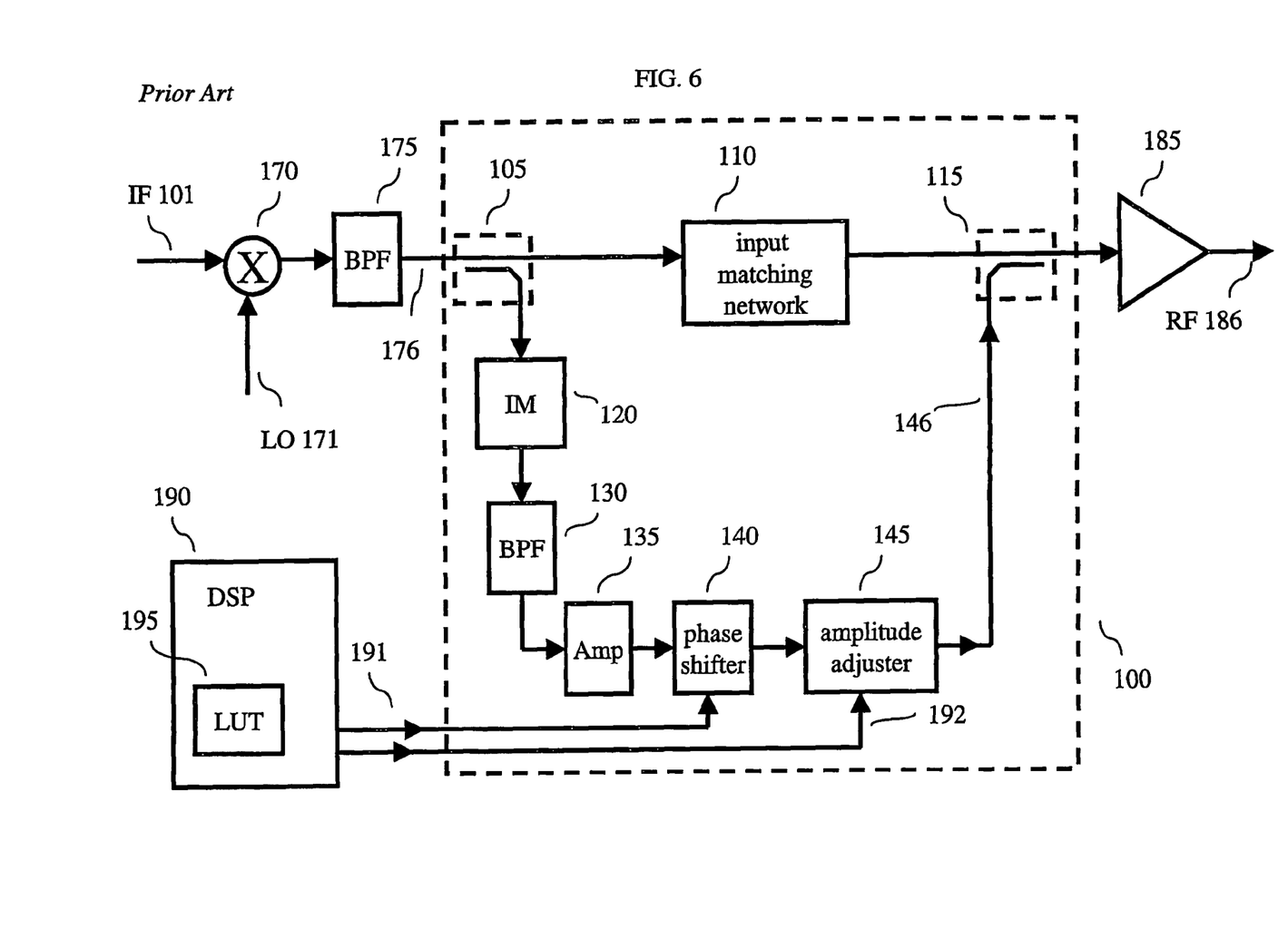
FIG. 6 shows a prior art predistorter.

For example, in the non-linear operating region the power amplifier may produce higher order intermodulation products into the signal-to-be-transmitted. As such, to reduce, if not substantially eliminate these higher order intermodulation products, a predistortor generates and injects second order harmonic products into the signal-to-be transmitted as illustrated in FIG. 6. In particular, an intermediate frequency (IF) input signal 101 (IF 101) is applied to mixer 170, which, as known in the art, mixes IF 101 with a local oscillator (LO) signal 171 operating at the desired radio frequency (RF), to provide an upconverted RF signal to bandpass filter (BPF) 175. The LO signal 171 frequency value is equal to the desired RF frequency±the IF frequency, depending on the choice of the upper side or the lower side of the upconversion. For example, in the context of a wireless device operating in accordance with UMTS, the IF frequency is typically 380 MHz, the LO frequency is in the range of 1.54 Giga Hertz (GHz) ($10^9$ Hz) to 1.60 GHz. BPF 175 filters the upconverted RF signal to provide a filtered RF signal 176 to predistorter 100. In terms of this example, the RF signal frequencies are on the order of 1.92 GHz to 1.98 GHz. As such, predistorter 100 represents a microwave circuit as known in the art. Predistorter 100 includes coupler 105, input matching network 110, coupler 115, intermodulation generator (IM) 120, BPF 130, amplifier (AMP) 135, phase shifter 140, and amplitude adjuster 145. The filtered RF signal is applied to coupler 105. Coupler 105 is a "weak" directional, coupler and provides most of the filtered RF signal to coupler 115, via input matching network 110. However, a portion of the filtered RF signal (e.g., on the order of 20 dB (decibels)) is extracted by coupler 105 and provided to IM 120. The latter provides a non-linear function for generating second order harmonic products from the extracted portion of the filtered RF signal. The second order harmonic products provided by IM 120 are further shaped, via BPF 130, and then may be further amplified by amplifier (Amp) 135 to provide second order harmonic products of sufficient level to cancel intermodulation products. The phase and amplitude of the second order harmonic products from Amp 135 are further adjusted via phase shifter 140 and amplitude adjuster 145 for application to directional coupler 115. Coupler 115 injects the adjusted second order harmonic products 146 back into the filtered RF signal and provides a combined signal—the filtered RF signal and the adjusted second order harmonic products—to power amplifier 185, which provides RF output signal 186 (RF 186) for transmission. Digital signal processor (DSP) 190 controls phase shifter 140 and amplitude adjuster 145, via control signals 191 and 192, respectively, to adjust the phase and amplitude of the second order harmonic products such that amplification of the combined signal by power amplifier 185 now reduces, if not substantially eliminates, the higher order intermodulation products produced by the power amplifier. DSP 190 may include a look-up table (LUT) 195 in memory as known in the art for use in generating control signals 191 and 192, and digital-to-analog-converters (not shown) for generating the control signals.

Since IM 120 generates second order harmonic products, these signals operate at twice the RF signal frequency. As such, as wireless transmission frequencies continue to increase into the GHertz range, e.g., 2 GHz and higher, this in effect doubles the operating frequency requirements for the components of predistorter 100 of FIG. 6. Unfortunately, having to design at twice the operating frequency requirements for components, such as phase shifter 140, further increases their cost and affects the complexity of the overall predistorter implementation. For example, if the RF signal frequency is 2 GHz, designing at twice this operating frequency requires that the phase shifter operate at RF signal frequencies of 4 GHz. This imposes more stringent requirements on the permissible level of insertion loss, phase ripple and parasitics with respect to the component inductors, capacitors and varactors that typically comprise the phase shifter—all of which adds to the cost. In addition, more care must be taken in the circuit design and layout of the phase shifter to ensure manufacturability.

SUMMARY OF THE INVENTION

In view of the above, I have observed that it is possible to lessen at least some of the design requirements for a predistorter for use in a radio frequency (RF) wireless transmitter by operating the phase shifter of the predistorter at less than twice a carrier frequency of the RF transmitter—thus, also lessening the associated cost. Therefore, and in accordance with the principles of the invention, an RF transmitter includes a power amplifier and a predistorter for injecting a distortion signal into an RF signal prior to amplification for use in linearizing the power amplifier; wherein the predistorter includes a phase shifter operating at less than twice a carrier frequency of the RF signal.

In an embodiment of the invention, a radio frequency (RF) transmitter comprises a power amplifier for amplifying an RF signal to provide an RF output signal, and a predistorter that further includes a phase shifter, a mixer, an amplifier, a bandpass filter, an amplitude adjuster, a directional coupler and a processor. The phase shifter shifts a local oscillator (LO) signal at a carrier frequency of the RF output signal to provide a phase-shifted LO signal. The latter is applied to the mixer, which mixes the phase-shifted LO signal with an intermediate frequency signal to provide, via the bandpass filter and amplifier, a distortion signal, which is further processed by the amplitude adjuster. The directional coupler injects the adjusted distortion signal into the RF signal before amplification by the power amplifier. In this regard, the processor controls the phase shifter and the amplitude adjuster such that the adjusted distortion signal linearizes the operation of the power amplifier.

In another embodiment of the invention, a circuit board includes an RF integrated circuit (IC) coupled to a phase shifter and a power amplifier for amplifying an RF signal to provide an RF output signal. The RF integrated circuit provides a signal to the phase shifter, where the signal corresponds to at least one RF carrier of the RF signal. The phase shifter shifts the phase of the signal to provide a phase shifted signal back to the RF integrated circuit. The phase shifted signal is used for linearization of the power amplifier.

In view of the above, and in accordance with an aspect of the invention, the phase shifter operates at a lower frequency—thus potentially lowering the cost of wireless equipment, fixed or mobile.

DETAILED DESCRIPTION

Other than the inventive concept, the elements shown in the figures are well known and will not be described in detail. Also, familiarity with wireless communications systems, such as but not limited to UMTS, is assumed and is not described in detail herein. For example, other than the inventive concept, spread spectrum transmission and reception, cells (base stations), user equipment (UE), downlink channels, uplink channels, RAKE receivers, look-up tables and input matching networks are well known and not described herein. In addition, the inventive concept may be implemented using conventional programming techniques, which, as such, will not be described herein. Finally, like-numbers on the figures represent similar elements.

Figure 1:
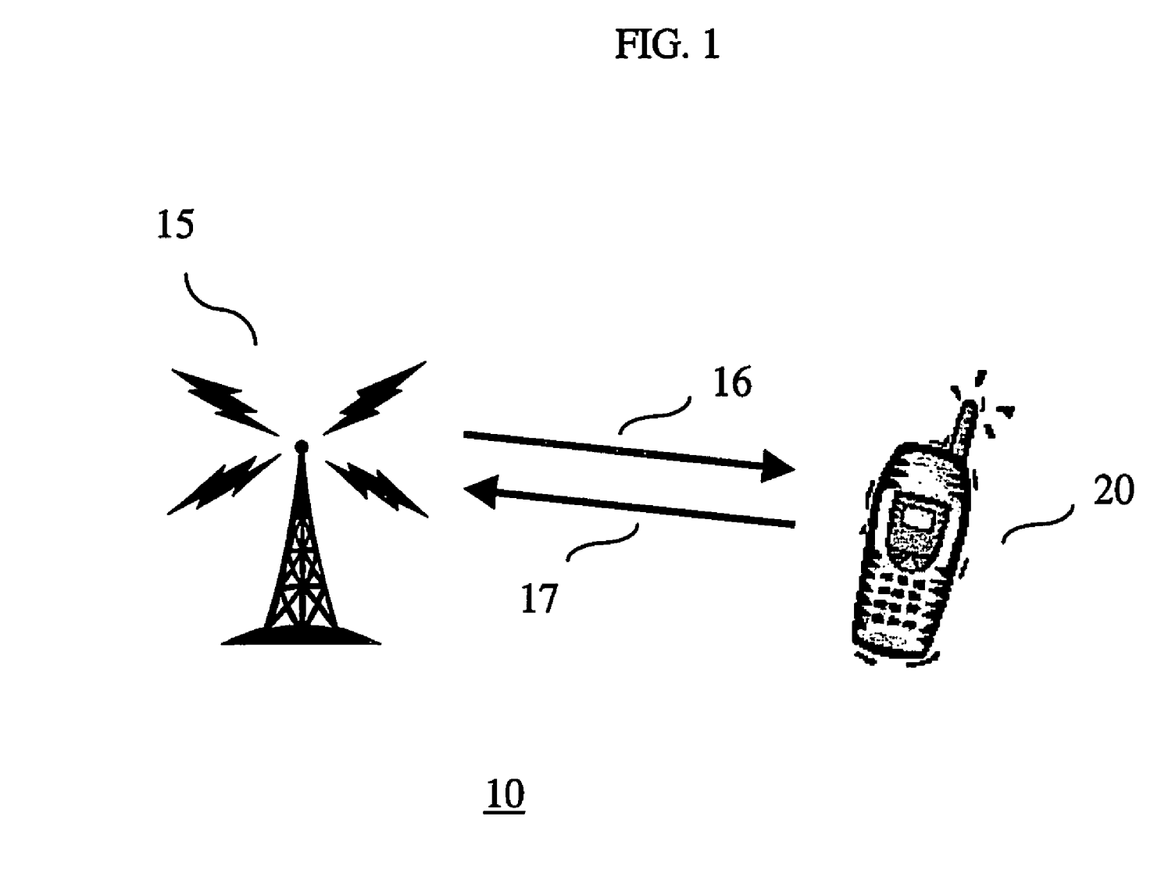
FIG. 1 shows a portion of an illustrative wireless communications system in accordance with the principles of the invention.

An illustrative portion of a UMTS wireless communications system 10 in accordance with the principles of the invention is shown in FIG. 1. Cell (or base station) 15 and UMTS User Equipment (UE) 20 communicate therebetween via downlink and uplink wireless signals 16 and 17, respectively. As noted above, each wireless terminal (e.g., base station 15 and/or UE 20) includes a power amplifier for transmitting the respective uplink and downlink wireless signal. In this regard, attention should now be directed to FIG. 2, which illustrates an illustrative predistorter 200 in accordance with the principles of the invention for use in a wireless terminal for linearizing a power amplifier.

Figure 2:
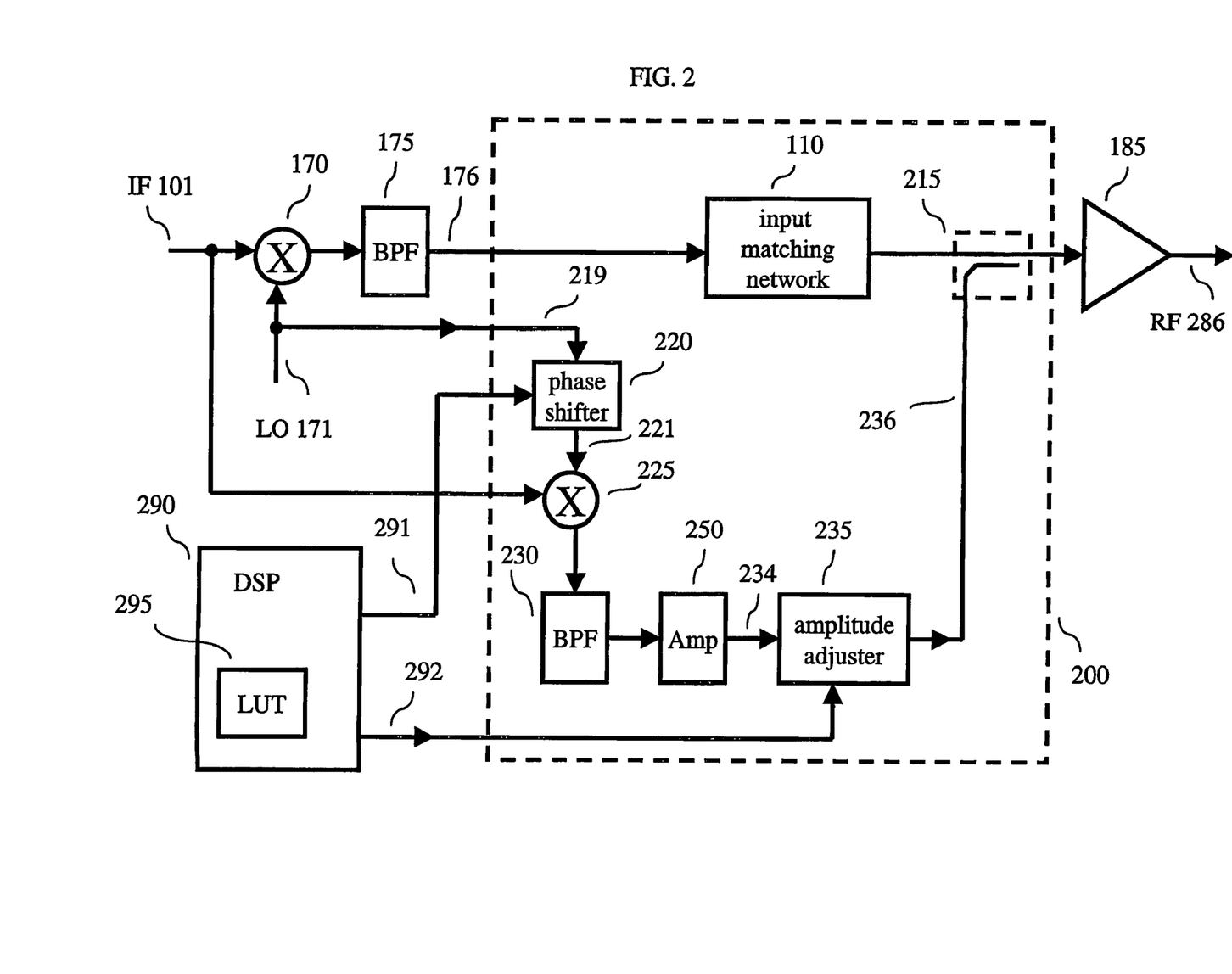
FIG. 2 shows an illustrative predistorter in accordance with the principles of the invention.

FIG. 2 shows an illustrative transmitter front-end portion of a wireless terminal comprising a mixer 170, a band pass filter (BPF) 175, predistorter 200, power amplifier 185 and digital signal processor 290. The latter includes memory for storing a look-up table (LUT) 295 (discussed below). Predistorter 200 includes input matching network 110, coupler 215, phase shifter 220, mixer 225, BPF 230, amplifier 250 and amplitude adjuster 235. An IF input signal 101 (IF 101) is applied to mixer 170, which mixes IF 101 with a LO signal 171 operating at the desired RF frequency, to provide an upconverted RF signal to BPF 175. The LO signal 171 frequency value is equal to the desired RF frequency±the IF frequency, depending on the choice of the upper side or the lower side of the upconversion. For example, in the context of a wireless device operating in accordance with UMTS, the IF frequency is typically 380 MHz, the LO frequency is in the range of 1.54 GHz to 1.60 GHz. BPF 175 filters the upconverted RF signal to provide a filtered RF signal 176 to predistorter 200. In terms of this example, the RF signal frequencies are on the order of 1.92 GHz to 1.98 GHz (GHz) ($10^9$ Hz). As such, predistorter 200 represents a microwave circuit. The filtered RF signal 176 is applied to coupler 215, via input matching network 110. Coupler 215 injects the adjusted second order harmonic products (described below) back into the filtered RF signal and provides a combined signal—the filtered RF signal and the adjusted second order harmonic products—to power amplifier 185, which provides RF output signal 286 (RF 286) for transmission.

In accordance with the principles of the invention, predistorter 200 uses a phase shifter in the same signal path as the local oscillator signal—thus reducing the frequency operating requirements for the phase shifter and associated cost. In particular, LO signal 171 (also referred to as phase shifter input signal 219) is applied to phase shifter 220, which provides a phase shifted local oscillator signal 221 (also referred to as phase shifted signal 221) to mixer 225. Therefore, phase shifter 220 operates in the frequency range of 1.54 GHz to 1.60 GHz instead of the frequency range of 3.84 GHz to 3.96 GHz (in the neighborhood of twice the RF frequency). The amount of phase shift provided by phase shifter 220 is controlled by DSP 290 via control signal 291 (discussed below). It should be noted that the term "local oscillator signal" means any clock signal having the requisite frequency characteristics whether or not the clock signal is derived directly from a crystal oscillator or synthesized in hardware such as a Phase Locked Loop apparatus. Also applied to mixer 225 is IF signal 101. As such, mixer 225 is used as a non-linear function generator since mixer 225 not only up-converts the IF signal but generates second order harmonic products as well. The amount of phase shift provided by phase shifter 220 controls the phase of the generated second order harmonic products. The output signal from mixer 225 is further shaped by BPF 230 to isolate the generated second order harmonic products (e.g., the passband of BPF 230 is centered about the second harmonic) and amplified by amplifier (AMP) 250 to provide a distortion signal of sufficient level to cancel intermodulation products. The resulting signal, distortion signal 234, representing just the second order harmonic products, is applied to amplitude adjuster 235. The latter, under the control of DSP 290, via control signal 292, adjusts the magnitude of distortion signal 234 and provides an amplitude adjusted output signal 236—the adjusted second order harmonic products (also referred to as adjusted distortion signal 236)—to coupler 215 for injection into the filtered RF signal, described above.

Digital signal processor (DSP) 290 controls phase shifter 220 and amplitude adjuster 235, via control signals 291 and 292, respectively, to adjust the phase and amplitude of the second order harmonic products such that amplification of the combined signal by power amplifier 185 now reduces, if not substantially eliminates, the higher order intermodulation products produced by the power amplifier. In other words, DSP 290 controls the phase shifter and the amplitude adjuster such that the adjusted distortion signal 236 linearizes the operation of the power amplifier. DSP 290 may include a look-up table (LUT) 295 as known in the art for use in generating control signals 291 and 292, and digital-to-analog-converters (not shown) for generating the control signals. In particular, LUT 295 provides values for setting control signals 291 and 292 for adjustment of the phase and amplitude, respectively.

Figure 3:
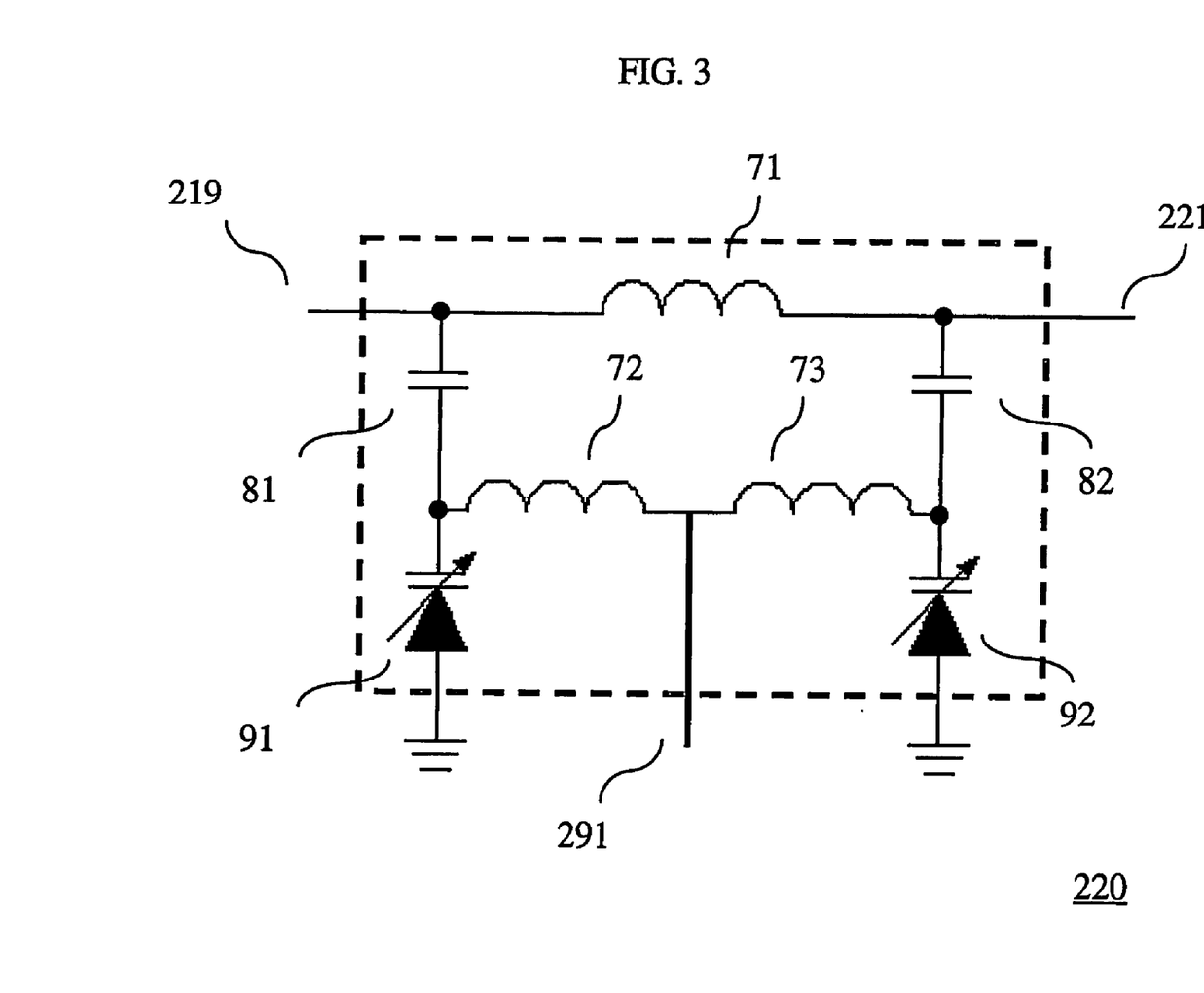
FIGS. 3 and 4 show an illustrative phase shifter and amplitude adjuster, respectively, for use in the predistorter of FIG. 2.
Figure 4:
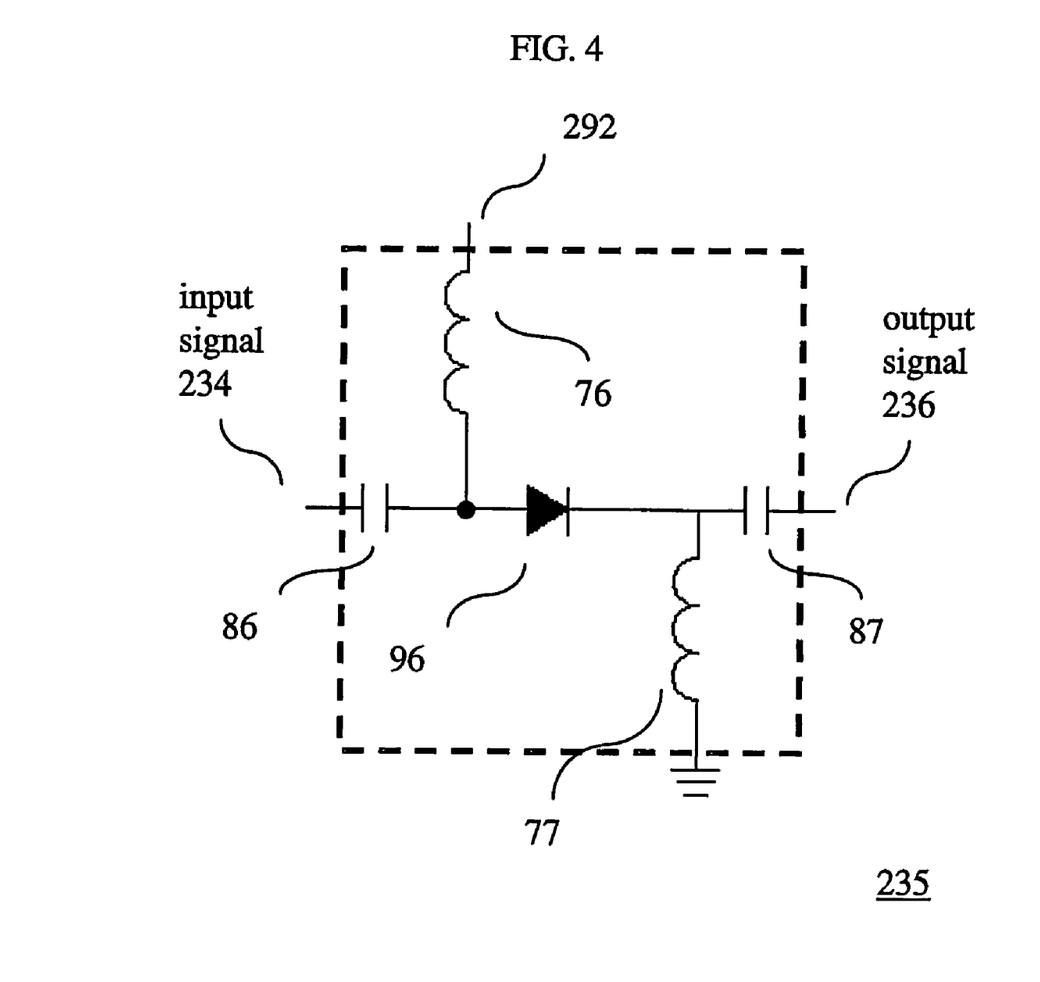

Referring now to FIGS. 3 and 4, illustrative implementations of phase shifter 220 and amplitude adjuster 235 are shown. Other than the inventive concept, the designs of a phase shifter and an amplitude adjuster are known and not described in detail herein. As such, specific circuit values for the components illustrated in FIGS. 3 and 4 are not shown in these figures. Turning first to FIG. 3, an illustrative implementation of phase shifter 220 is shown. Phase shifter 220 receives an input signal 219 and provides a phase shifted signal 221. The amount of phase shift is controlled by control signal 291, which is typically a DC voltage. Phase shifter 220 includes capacitors 81 and 82; inductors 71, 72 and 73; and varactors 91 and 92. Turning now to FIG. 4, an illustrative implementation of amplitude adjuster 235 is shown. Amplitude adjuster 235 receives an input signal (represented by distortion signal 234) having an amplitude and phase and adjusts the amplitude thereof to provide an amplitude adjusted signal, i.e., an output signal as represented by adjusted distortion signal 236. The phase of output signal 236 is substantially the same as, if not identical to, the phase of the input signal. The amount of amplitude adjustment is controlled by control signal 292, which is typically a DC voltage. Amplitude adjuster 235 includes capacitors 86 and 87; inductors 77 and 77; and a positive-intrinsic-negative (PIN) diode 96.

Figure 5:
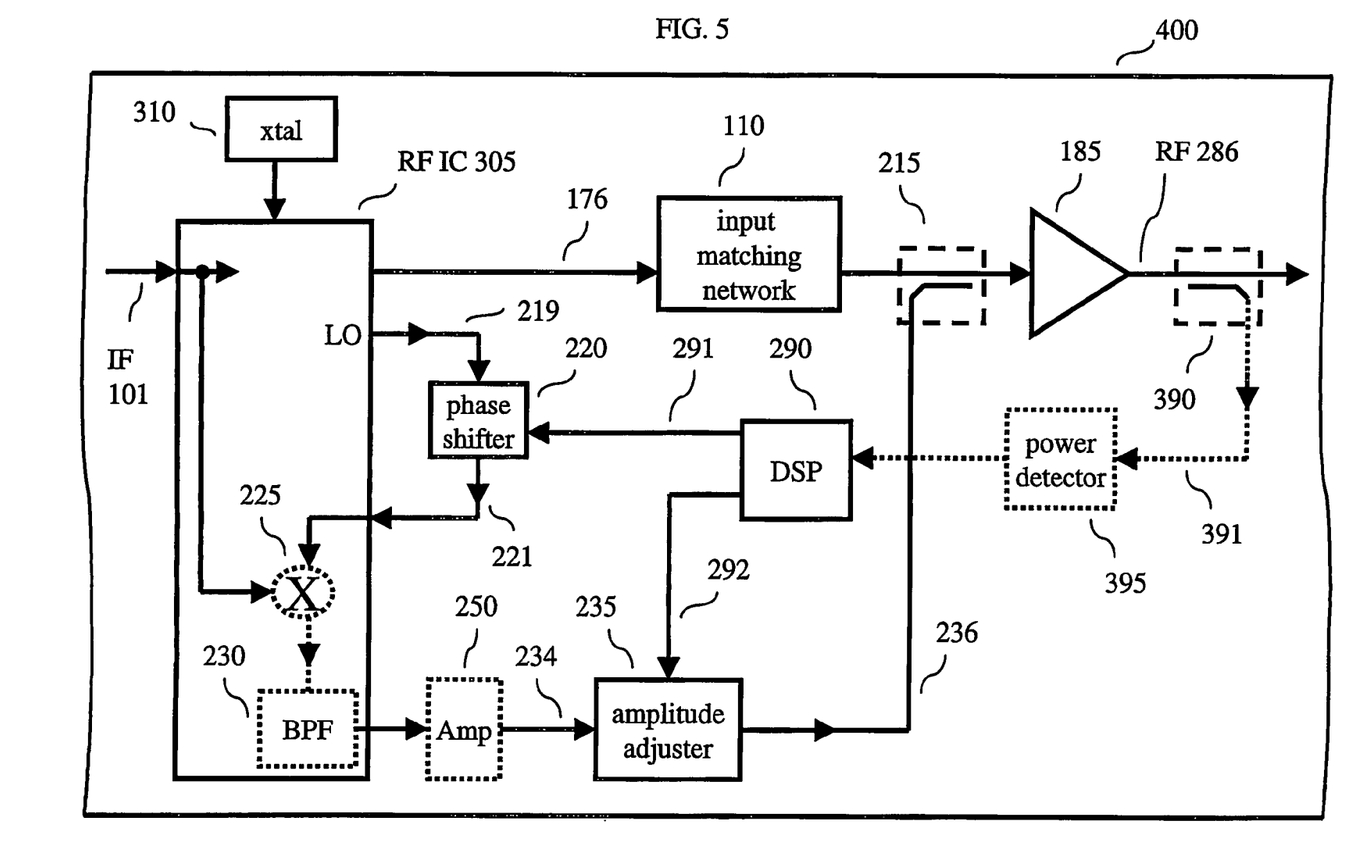
FIG. 5 shows another illustrative predistorter in accordance with the principles of the invention.

Another embodiment of a transmitter front end incorporating a predistorter in accordance with the principles of the invention is shown in FIG. 5. Other than as described below, the predistorter shown in FIG. 5 functions in a similar fashion to the predistorter of FIG. 2, described above. A portion of a circuit board 400 includes crystal (xtal) 310, radio frequency integrated circuit (RF IC) 305, input matching network 110, coupler 215, phase shifter 220, amplifier 250, amplitude adjuster 235, DSP 290, power detector 395 and coupler 390. In this embodiment, a portion of an RF integrated circuit (IC) 305 is used to provide some of the processing for the predistorter, namely those functions previously provided by mixer 225 and BPF 230 as indicated in dotted line form in RF IC 305. Other than the inventive concept, RF ICs are known in the art, as such only relevant portions of RF IC 305 are shown in FIG. 5. In particular, RF IC 305 receives a clock signal from xtal 310 and derives therefrom a local oscillator (LO) signal, which is used internally by RF IC 305 and also externally provided via an output pin, as represented by signal 219, to phase shifter 220. In addition, RF IC 305 receives the input IF signal 101, upconverts this signal (using the internally available LO signal) and provides therefrom a filtered RF signal 176 to coupler 215 via input matching network 110. As before, coupler 215 injects the adjusted second order harmonic products (described below) back into the filtered RF signal and provides a combined signal—the filtered RF signal and the adjusted second order harmonic products—to power amplifier 185, which provides RF output signal 286 (RF 286) for transmission.

In accordance with the principles of the invention, the local oscillator signal is coupled to phase shifter 220, which provides a phase shifted local oscillator signal 221 (also referred to as phase shifted signal 221) to an input pin of RF IC 305. The amount of phase shift provided by phase shifter 220 is controlled by DSP 290 via control signal 291 (described above). RF IC 305 uses the phase shifted signal 221 to generate therefrom a distortion signal 234, which represents second order harmonic products (described above). As before, amplifier (AMP) 250 (shown in dotted line form) may be present to ensure that distortion signal 234 is of a sufficient level to cancel intermodulation products. Illustratively, RF IC 305 generates distortion signal 234 by mixing the phase shifted signal 221 with IF signal 101. However, the inventive concept is not so limited and distortion signal 234 may be generated in other ways. Distortion signal 234 is applied to amplitude adjuster 235. The latter, under the control of DSP 290, via control signal 292, adjusts the magnitude of signal 234 and provides an adjusted distortion signal 236 to coupler 215 for injection into the filtered RF signal, described above.

It can be observed from FIG. 5, that DSP 290 may also monitor the power level of RF output signal 286 via coupler 390 and the power detector 395 as shown in dotted-line form. Coupler 390 is a "weak" directional coupler and provides most of RF output signal 286 for transmission. However, a portion of RF output signal 286, as represented by signal 391, is fed back to DSP 390 for monitoring of the power level of RF output signal 286.

The illustrative predistorters described above in accordance with the principles of the invention may be arranged on a circuit board, e.g., a printed circuit board (PCB) or printed wiring board (PWB). The circuit boards may be of any form factor. For example, the inventive concept may be embodied in a wireless terminal such as a wireless phone or a printed circuit card, such as a PCMCIA-type (Personal Computer Memory Card International Association) card for use, e.g., in a lap-top computer.

As described above, and in accordance with the principles of the invention, a predistorter controls the phase of an injected second harmonic product in such a way that the phase-shifter operates at a lower frequency than is typically done. Illustratively, the phase shifter operates at the RF signal frequency, or RF carrier frequency. Thus, the operating frequency requirements for the components of predistorter 200 of FIG. 2 or predistorter 400 of FIG. 5 are relaxed, which reduces their cost and simplifies the overall predistorter implementation. For example, operation at RF signal frequencies in the neighborhood of 2 GHz—instead of 4 GHz—imposes less stringent requirements on the permissible level of insertion loss, phase ripple and parasitics with respect to the component inductors, capacitors and varactors that typically comprise the phase shifter—all of which affects the cost. Similarly, if the RF signal frequency is 4 GHz, a predistorter in accordance with the principles of the invention allows operation of the phase shifter at 4 Ghz rather than at 8 GHz.

It should be noted that other variations are possible in accordance with the principles of the invention. For example, the predistorter described above may also include a delay element in place of and/or in addition to the input matching network to additionally compensate for any time delays in controlling digitally the distortion signal.

As such, the foregoing merely illustrates the principles of the invention and it will thus be appreciated that those skilled in the art will be able to devise numerous alternative arrangements which, although not explicitly described herein, embody the principles of the invention and are within its spirit and scope. For example, although illustrated in the context of separate functional elements, these functional elements may be embodied on one or more integrated circuits (ICs) and/or in one or more stored program-con-

The invention claimed is:

1. Apparatus for use in a wireless transmitter, the apparatus comprising:
   an amplifier for amplifying a radio frequency (RF) signal to provide an RF output signal for transmission; and
   a predistorter for injecting a distortion signal into the RF signal prior to amplification for use in linearizing the amplifier;
   wherein the predistorter includes a phase shifter operating at less than twice a carrier frequency of the RF signal and further including a signal path for conveying a clock signal having a frequency less than twice a carrier frequency of the RF signal and wherein the predistorter is in the signal path of the clock signal;
   wherein the phase shifter adjusts a phase of the clock signal and provides a phase-shifted clock signal, and wherein the predistorter further comprises:
   a mixer responsive to the phase-shifted clock signal and an intermediate frequency (IF) signal for providing the distortion signal;
   an amplitude adjuster coupled to the mixer for adjusting an amplitude of the distortion signal before application to the amplifier;
   a directional coupler disposed between the amplitude adjuster and the amplifier for injecting the distortion signal into the RE signal; and
   a processor for controlling the phase shifter and amplitude adjuster such that the distortion signal linearizes the amplifier.

2. The apparatus of claim 1, wherein the processor is a digital signal processor.

3. The apparatus of claim 1, further including an upconverter for converting the IF signal to the RF signal.

4. The apparatus of claim 1, further including an amplifier for amplifying the distortion signal before application to the amplitude adjuster.

5. The apparatus of claim 1, wherein the predistorter includes no more than one directional coupler.

6. Apparatus for use in a wireless transmitter, comprising:
   an amplifier for amplifying an RF signal and a distortion signal to provide an RF output signal for transmission, where the RF signal has a carrier frequency;
   a phase shifter for receiving a clock signal having a frequency less than twice the carrier frequency and for providing a phase-shifted signal, wherein a change in phase of the phase-shifted signal results in a change in phase of the distortion signal;
   a radio frequency (RF) integrated circuit (IC) for providing the RF signal and the clock signal; and wherein the RE IC is responsive to the phase shifted signal for providing the distortion signal;
   an amplitude adjuster for adjusting an amplitude of the distortion signal;
   a directional coupler disposed between the amplitude adjuster and the amplifier for injecting the distortion signal into the RE signal; and
   a processor for controlling the phase shifter and amplitude adjuster such that the distortion signal linearizes the amplifier.

7. The apparatus of claim 6, wherein the processor is a digital signal processor.

8. The apparatus of claim 6, further including no more than one directional coupler in a circuit path between the amplifier and the RF integrated circuit.

9. The apparatus of claim 6, further including an amplifier for amplifying the distortion signal before application to the amplitude adjuster.

10. Apparatus for use in linearizing an amplifier of a wireless transmission system, wherein the amplifier amplifies a radio frequency (RF) signal for transmission, the apparatus comprising:
    a source of a clock signal having a frequency less than twice a frequency of the RF signal;
    a phase shifter responsive to the clock signal for providing a phase-shifted clock signal;
    a distortion generator responsive to the phase-shifted clock signal for providing a distortion signal;
    an amplitude adjuster responsive to the distortion signal for adjusting an amplitude thereof;
    a coupler disposed between the amplitude adjuster and the amplifier for injecting the distortion signal into the amplifier; and
    a controller for controlling the phase shifter and the amplitude adjuster such that the distortion signal coupled into the amplifier linearizes the amplifier.

11. The apparatus of claim 10, wherein the phase shifter is coupled to the source via a signal path, which conveys the clock signal.

12. The apparatus of claim 10, further including an amplifier for amplifying the distortion signal before application to the amplitude adjuster.

* * * * *